United States Patent
Yasusaka

(10) Patent No.: US 11,881,863 B2
(45) Date of Patent: Jan. 23, 2024

(54) COMPARATOR CIRCUIT

(71) Applicant: Rohm Co., Ltd., Kyoto (JP)

(72) Inventor: Makoto Yasusaka, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 17/912,250

(22) PCT Filed: Mar. 8, 2021

(86) PCT No.: PCT/JP2021/008874
§ 371 (c)(1),
(2) Date: Sep. 16, 2022

(87) PCT Pub. No.: WO2021/187183
PCT Pub. Date: Sep. 23, 2021

(65) Prior Publication Data
US 2023/0208413 A1    Jun. 29, 2023

(30) Foreign Application Priority Data

Mar. 18, 2020 (JP) .................................. 2020-048079

(51) Int. Cl.
*H03K 5/24* (2006.01)
*H03K 5/13* (2014.01)
(52) U.S. Cl.
CPC ............. *H03K 5/2472* (2013.01); *H03K 5/13* (2013.01)
(58) Field of Classification Search
None
See application file for complete search history.

(56) References Cited

U.S. PATENT DOCUMENTS

2013/0021109 A1* 1/2013 Niederl ............... H03K 3/0231
331/111
2017/0194952 A1* 7/2017 Xu ........................... H03B 5/04

FOREIGN PATENT DOCUMENTS

JP        2003337146        11/2003

OTHER PUBLICATIONS

International Search Report in International Appln. No. PCT/JP2021/008874, dated May 25, 2021, 5 pages (with English Translation).

* cited by examiner

*Primary Examiner* — Daniel C Puentes
(74) *Attorney, Agent, or Firm* — Fish & Richardson P.C.

(57) ABSTRACT

A comparator circuit includes a first comparator configured to compare a voltage based on an input voltage with a first reference voltage, a charge/discharge portion configured to switch between charging and discharging of a capacitor based on an output of the first comparator, a second comparator configured to compare a voltage of the capacitor with a second reference voltage, and a control portion. The control portion is configured to, in a case where the voltage of the capacitor is larger than a predetermined value when the charge/discharge portion performs switching from the charging of the capacitor to the discharging thereof, supply a predetermined voltage instead of the voltage based on the input voltage to the first comparator until the voltage of the capacitor becomes smaller than the predetermined value so that the discharging of the capacitor is maintained by the charge/discharge portion.

8 Claims, 9 Drawing Sheets to a comparator circuit capable of adjusting a signal trans-
COMPARATOR CIRCUIT

TECHNICAL FIELD

The invention disclosed in the present description relates
mission time.

BACKGROUND ART

A general comparator circuit capable of adjusting a signal transmission time is disclosed in, for example, Patent Document 1. In the general comparator circuit capable of adjusting a signal transmission time, the signal transmission time is adjusted using a delay time defined by a capacitance of a capacitor, a charging current for charging the capacitor, and a reference voltage compared with a voltage of the capacitor.

CITATION LIST

Patent Literature

Patent Document 1: JP-A-2003-337146 (FIG. 4)

SUMMARY OF INVENTION

Technical Problem

In switching from a state of discharging the capacitor to a state of charging the capacitor, however, when the capacitor, while being not completely discharged, undergoes the switching from the capacitor discharging state to the capacitor charging state, the above-described delay time might become shorter than its original value.

Solution to Problem

A comparator circuit disclosed in the present description includes a first comparator configured to compare a voltage based on an input voltage with a first reference voltage, a charge/discharge portion configured to switch between charging and discharging of a capacitor based on an output of the first comparator, a second comparator configured to compare a voltage of the capacitor with a second reference voltage, and a control portion configured to, in a case where the voltage of the capacitor is larger than a predetermined value when the charge/discharge portion performs switching from the charging of the capacitor to the discharging of the capacitor, supply a predetermined voltage instead of the voltage based on the input voltage to the first comparator until the voltage of the capacitor becomes smaller than the predetermined value so that the discharging of the capacitor is maintained by the charge/discharge portion.

A semiconductor integrated circuit apparatus disclosed in the present description includes the above-described comparator circuit.

Advantageous Effects of Invention

According to the comparator circuit disclosed in the present description, it is possible to suppress a phenomenon in which a delay time becomes shorter than its original value.

DESCRIPTION OF EMBODIMENTS

In the present description, a constant current refers to a current that is constant in an ideal state and is a current that is actually slightly variable with a change in temperature or the like.

In the present description, a reference voltage refers to a voltage that is constant in an ideal state and is a voltage that is actually slightly variable with a change in temperature or the like.

In the present description, a MOS transistor refers to a transistor having a gate structure composed of at least three layers that are a "layer of an electric conductor or a semiconductor having a small resistance value, such as polysilicon," an "insulation layer," and a "P-type, N-type, or intrinsic semiconductor layer." That is, the gate structure of the MOS transistor is not limited to a three-layer structure composed of a metal, an oxide, and a semiconductor.

Reference Example

Figure 1:
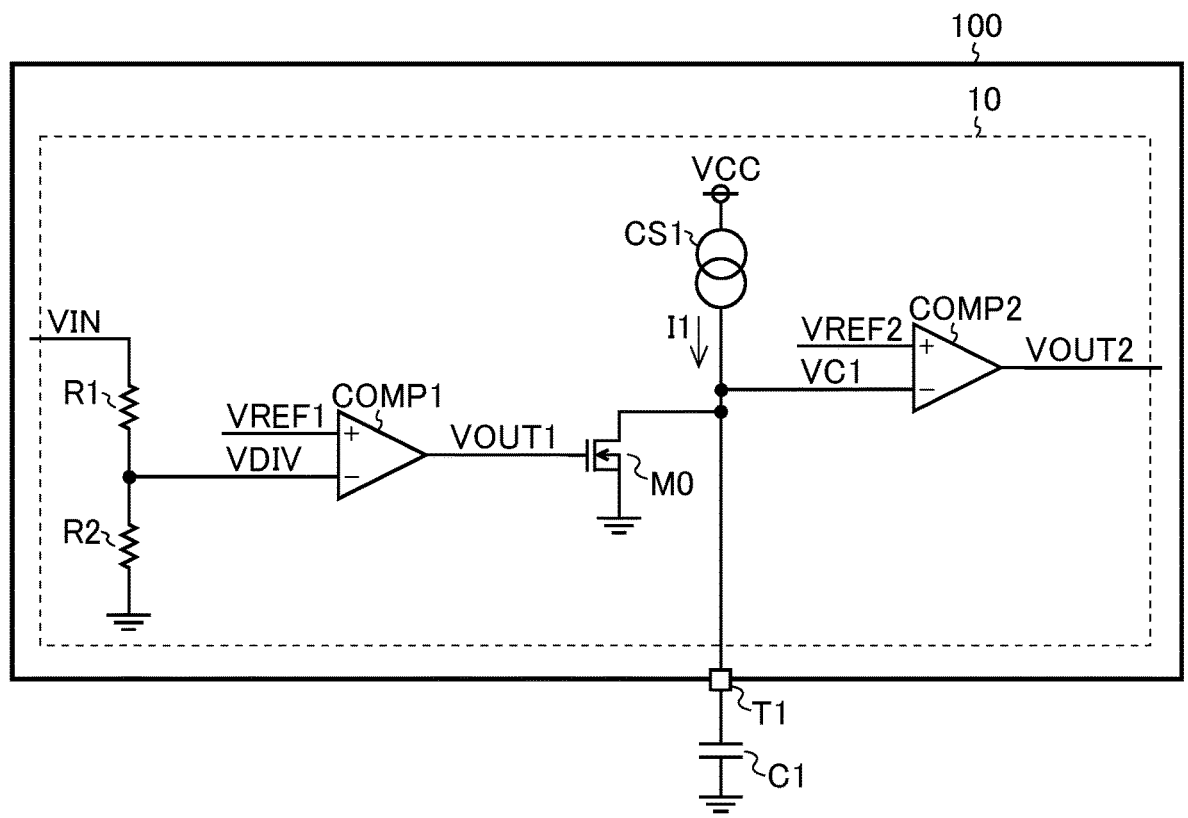
FIG. 1 is a diagram showing a schematic configuration of a semiconductor integrated circuit apparatus according to a reference example.

FIG. 1 is a diagram showing a schematic configuration of a semiconductor integrated circuit apparatus 100 according to a reference example. The semiconductor integrated circuit apparatus 100 according to the reference example includes a comparator circuit 10 according to the reference example and a terminal T1. A capacitor C1 is externally connected to the terminal T1 of the semiconductor integrated circuit apparatus 100 according to the reference example.

The comparator circuit 10 according to the reference example includes resistors R1 and R2, a first comparator COMP1, an N-channel type discharging MOS transistor M0, a current source CS1, and a second comparator COMP2.

An input voltage VIN is applied to one end of the resistor R1. The other end of the resistor R1 is connected to an inversion input terminal of the first comparator COMP1 and one end of the resistor R2. The other end of the resistor R2 is connected to a ground potential.

A first reference voltage VREF1 is applied to a non-inversion input terminal of the first comparator COMP1. An output terminal of the first comparator COMP1 is connected to a gate of the discharging MOS transistor M0. A source of the discharging MOS transistor M0 is connected to the ground potential.

A power source voltage VCC is applied to one end of the current source CS1. The other end of the current source CS1 is connected to a drain of the discharging MOS transistor M0, the terminal T1, and an inversion input terminal of the second comparator COMP2. A second reference voltage VREF2 is applied to a non-inversion input terminal of the second comparator COMP2.

One end of the capacitor C1 is externally connected to the terminal T1, and the other end of the capacitor C1 is connected to the ground potential.

The thus configured comparator circuit 10 according to the reference example operates as follows.

The resistors R1 and R2 generate a voltage based on the input voltage VIN. Specifically, the resistors R1 and R2 generate a voltage VDIV that is a division voltage of the input voltage VIN.

The first comparator COMP1 compares the voltage VDIV with the first reference voltage VREF1 and outputs a voltage VOUT1 indicating a result of the comparison. When the voltage VDIV is smaller than the first reference voltage VREF1, the first comparator COMP1 sets the voltage VOUT1 to a HIGH level. When the voltage VDIV is larger than the first reference voltage VREF1, the first comparator COMP1 sets the voltage VOUT1 to a LOW level.

The discharging MOS transistor M0 is turned on when the voltage VOUT1 is at the HIGH level and turned off when the voltage VOUT1 is at the LOW level.

The capacitor C1 is discharged when the discharging MOS transistor M0 is on and is charged with a constant current I1 outputted from the current source CS1 when the discharging MOS transistor M0 is off.

The second comparator COMP2 compares a voltage VC1 of the capacitor C1 (a voltage on one end side of the capacitor C1) with the second reference voltage VREF2 and outputs a voltage VOUT2 indicating a result of the comparison. When the voltage VC1 is smaller than the second reference voltage VREF2, the second comparator COMP2 sets the voltage VOUT2 to the HIGH level. When the voltage VC1 is larger than the second reference voltage VREF2, the second comparator COMP2 sets the voltage VOUT2 to the LOW level.

Figure 2:
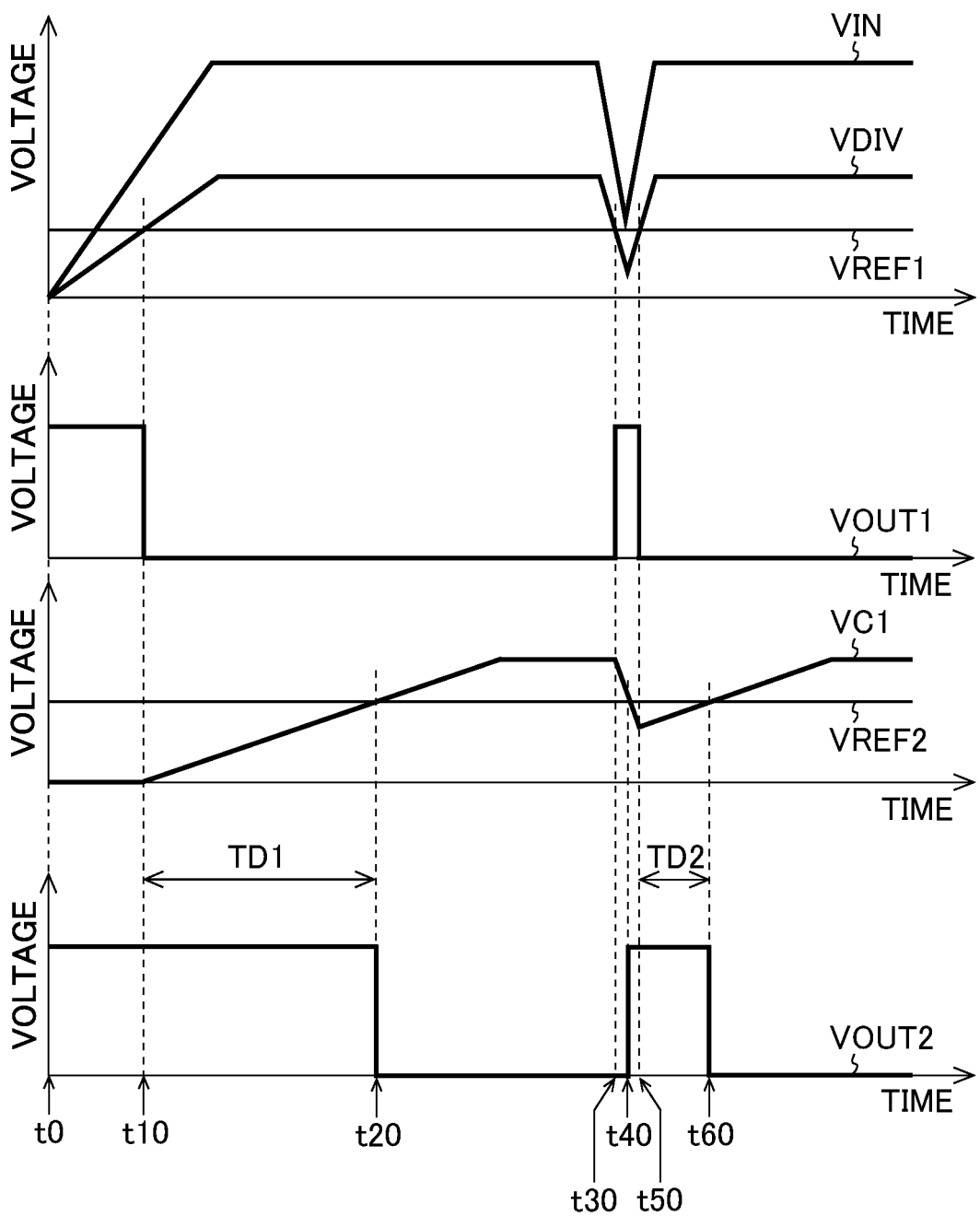
FIG. 2 is a time chart showing voltage waveforms of a comparator circuit according to the reference example.

FIG. 2 is a time chart showing voltage waveforms of the comparator circuit 10 according to the reference example in a case where the input voltage VIN rises and then temporarily decreases. A horizontal axis of each graph shown in FIG. 2 indicates a time, and a vertical axis of each graph shown in FIG. 2 indicates a voltage. It is assumed that the capacitor C1 is completely discharged at timing to.

At timing t10 at which the voltage VOUT1 is switched from the HIGH level to the LOW level, charging of the capacitor C1 is started. During the charging of the capacitor C1, the voltage VC1 of the capacitor C1 increases at an inclination (an increase rate) defined by a value of the constant current I1 and a capacitance value of the capacitor C1.

At timing t20 at which the voltage VC1 of the capacitor C1 exceeds the second reference voltage VREF2, the voltage VOUT2 is switched from the HIGH level to the LOW level. In this case, a delay time TD1 from the timing t10 to the timing t20 is an amount of time obtained by multiplying a capacitance value of the capacitor C1 by a value of the second reference voltage VREF2 and dividing a resulting product by a value of the constant current I1.

In the case where the input voltage VIN temporarily decreases, however, charging of the capacitor C1 is started before the capacitor C1 is completely discharged, so that a delay time TD2 in this case is shorter than the delay time TD1 as an original value.

For example, when, after the timing t20, the input voltage VIN decreases to such an extent that the voltage VDIV becomes smaller than the first reference voltage VREF1, the voltage VOUT1 is switched from the LOW level to the HIGH level (timing t30). Discharging of the capacitor C1 is started from the timing t30 to decrease the voltage VC1 of the capacitor C1.

When the voltage VC1 becomes smaller than the second reference voltage VREF2, the voltage VOUT2 is switched from the LOW level to the HIGH level (timing t40). After that, when the input voltage VIN increases to such an extent that the voltage VDIV becomes larger than the first reference voltage VREF1, the voltage VOUT1 is switched from the HIGH level to the LOW level (timing t50). Charging of the capacitor C1 is started from the timing t50 to increase the voltage VC1 of the capacitor C1.

When the voltage VC1 becomes larger than the second reference voltage VREF2, the voltage VOUT2 is switched from the HIGH level to the LOW level (timing t60). The delay time TD2 from the timing t50 to the timing t60 is shorter than the delay time TD1 as the original value.

A signal transmission time is adjusted using a delay time, and thus it is possible, for example, to control a sequence of a device provided subsequently to the comparator circuit 10 according to the reference example and to prevent malfunctioning or the like of the semiconductor integrated circuit apparatus 100 due to noise. That is, when the delay time becomes shorter than its original value, sequence control and prevention of malfunctioning or the like might be adversely affected.

First Embodiment

Figure 3:
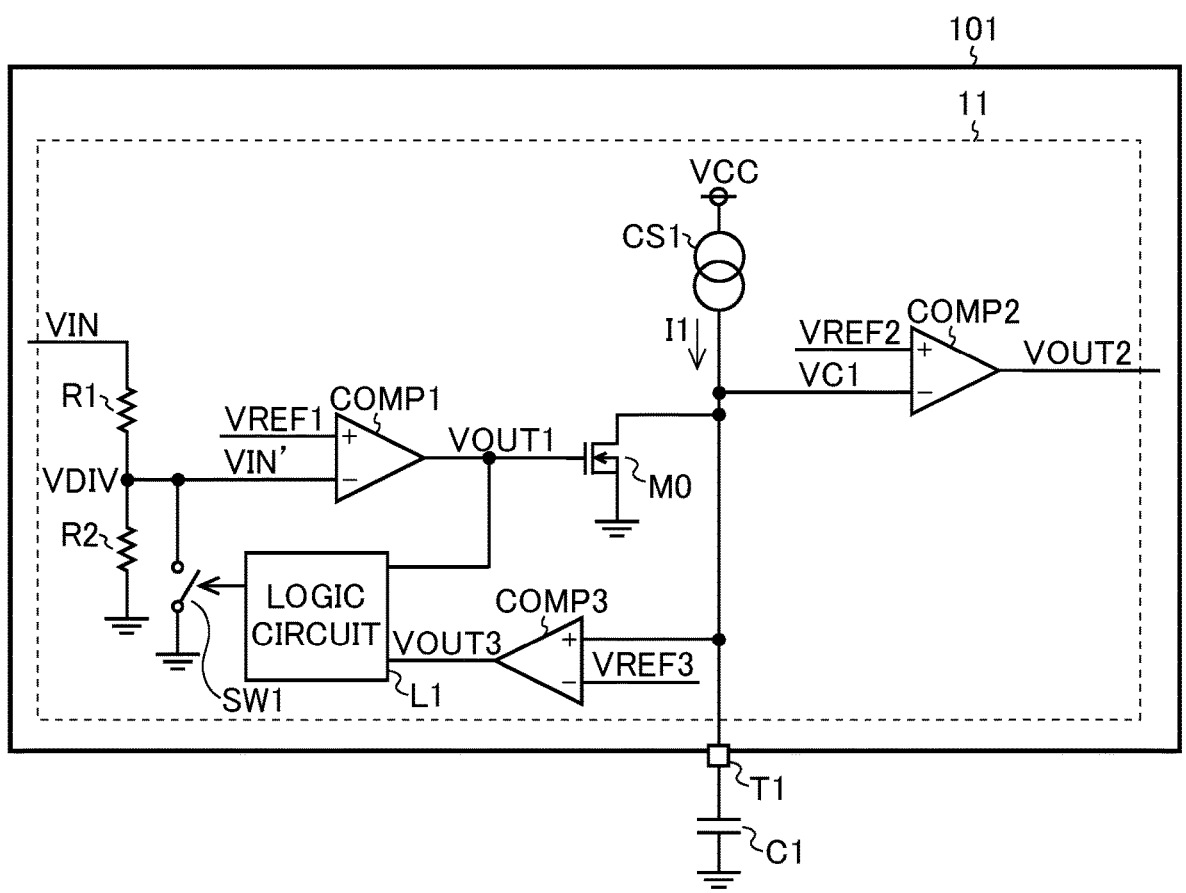
FIG. 3 is a diagram showing a schematic configuration of a semiconductor integrated circuit apparatus according to a first embodiment.

FIG. 3 is a diagram showing a schematic configuration of a semiconductor integrated circuit apparatus 101 according to a first embodiment. In FIG. 3, components common to those in FIG. 1 are denoted by like reference characters, and detailed descriptions thereof are omitted as appropriate.

The semiconductor integrated circuit apparatus 101 according to the first embodiment includes a comparator circuit 11 according to the first embodiment and a terminal T1. A capacitor C1 is externally connected to the terminal T1 of the semiconductor integrated circuit apparatus 101 according to the first embodiment.

The comparator circuit 11 according to the first embodiment includes resistors R1 and R2, a first comparator COMP1, a discharging MOS transistor M0, a current source CS1, a second comparator COMP2, a third comparator COMP3, a logic circuit L1, and a switch SW1.

The discharging MOS transistor M0 and the current source CS1 are an example of a charge/discharge portion that is configured to switch between charging and discharging of the capacitor C1 based on a voltage VOUT1.

The third comparator COMP3, the logic circuit L1, and the switch SW1 are an example of a control portion that is configured to, in a case where a voltage VC1 of the capacitor C1 is larger than a predetermined value when the above-described charge/discharge portion performs switching from the charging of the capacitor C1 to the discharging of the capacitor C1, supply a predetermined voltage instead of a voltage (a voltage VDIV) based on an input voltage VIN to the first comparator COMP1 until the voltage VC1 of the capacitor C1 becomes smaller than the predetermined value so that the discharging of the capacitor C1 is maintained by the above-described charge/discharge portion. Further, the logic circuit L1 and the switch SW1 are an example of a switching portion that is configured to switch, based on the voltage VOUT1 and a voltage VOUT3, between supplying the voltage (the voltage VDIV) based on the input voltage VIN to the first comparator COMP1 and supplying the predetermined voltage instead of the voltage (the voltage VDIV) based on the input voltage VIN to the first comparator COMP1.

In this embodiment, the above-described predetermined value is a value of a third reference voltage VREF 3, and the above-described predetermined voltage is a ground potential. Furthermore, while in this embodiment, the voltage VDIV that is a division voltage of the input voltage VIN is used as the voltage based on the input voltage VIN, for example, the input voltage VIN itself may be used as the voltage based on the input voltage VIN, or, for example, a voltage obtained by level shifting of the input voltage VIN may be used as the voltage based on the input voltage VIN.

A non-inversion input terminal of the third comparator COMP3 is connected to the other end of the current source CS1, a drain of the discharging MOS transistor M0, the terminal T1, and an inversion input terminal of the second comparator COMP2.

The third reference voltage VREF3 is applied to an inversion input terminal of the third comparator COMP3.

The voltage VOUT1 and the voltage VOUT3 are inputted to the logic circuit L1, and the logic circuit L1 controls the switch SW1 based on the voltage VOUT1 and the voltage VOUT3. One end of the switch SW1 is connected to the other end of the resistor R1, one end of the resistor R2, and an inversion input terminal of the first comparator COMP1. The other end of the switch SW1 is connected to the ground potential.

The third comparator COMP3 compares the voltage VC1 of the capacitor C1 with the third reference voltage VREF3 and outputs the voltage VOUT3 indicating a result of the comparison. When the voltage VC1 of the capacitor C1 is larger than the third reference voltage VREF3, the third comparator COMP3 sets the voltage VOUT3 to a HIGH level. When the voltage VC1 of the capacitor C1 is smaller than the third reference voltage VREF3, the third comparator COMP3 sets the voltage VOUT3 to a LOW level.

The logic circuit L1 switches on the switch SW1 when both of the voltage VOUT1 and the voltage VOUT3 are at the HIGH level and switches off the switch SW1 when at least one of the voltage VOUT1 and the voltage VOUT3 is at the LOW level.

Figure 4:
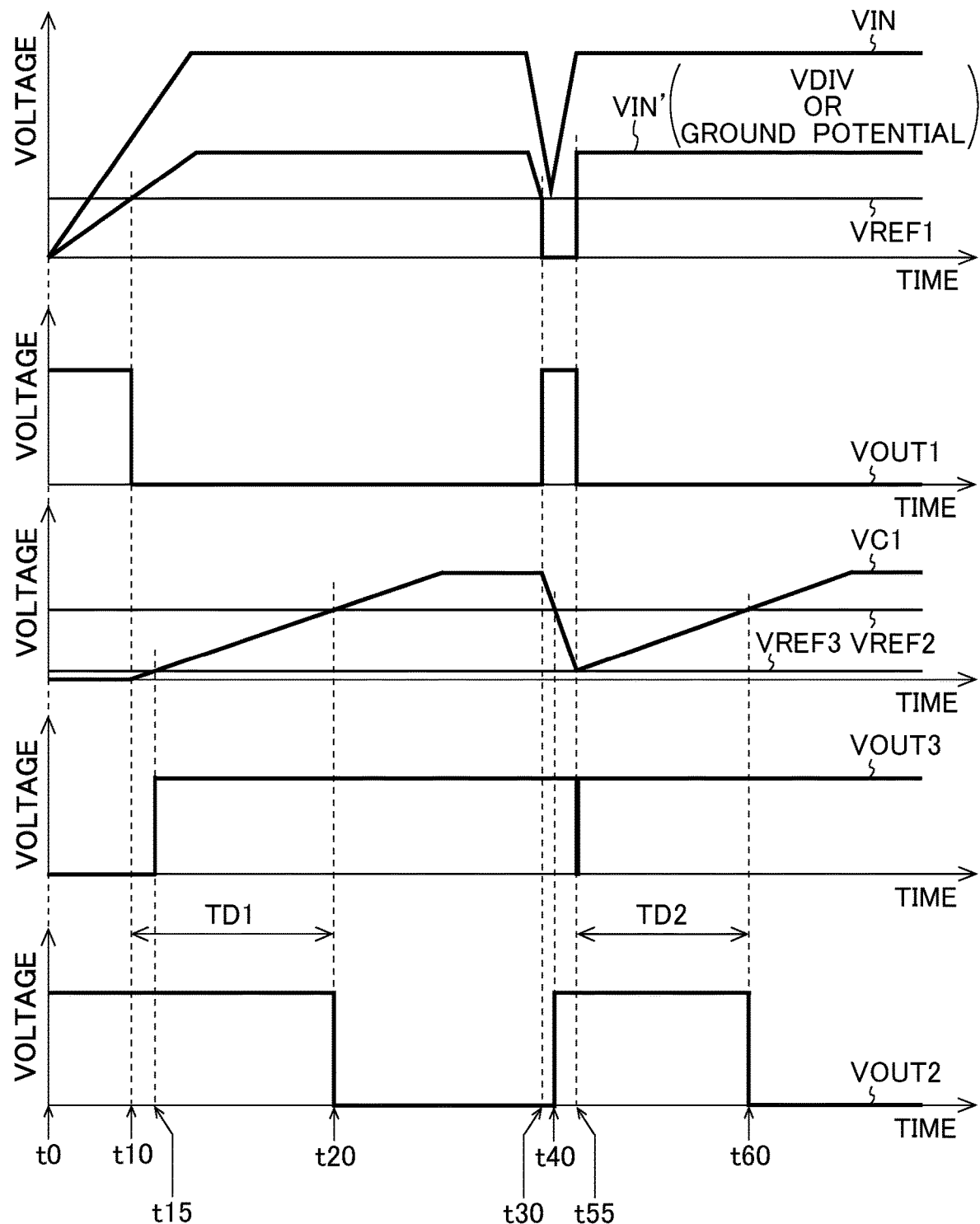
FIG. 4 is a time chart showing voltage waveforms of a comparator circuit according to the first embodiment.

FIG. 4 is a time chart showing voltage waveforms of the comparator circuit 11 according to the first embodiment in a case where the input voltage VIN rises and then temporarily decreases. A horizontal axis of each graph shown in FIG. 4 indicates a time, and a vertical axis of each graph shown in FIG. 4 indicates a voltage. It is assumed that the capacitor C1 is completely discharged at timing t0.

Here, descriptions of components common to those of the comparator circuit 10 according to the reference example are omitted.

After timing t10, the voltage VC1 of the capacitor C1 increases to such an extent as to exceed the third reference voltage VREF3, the voltage VOUT3 is switched from the LOW level to the HIGH level (timing t15). Even when the voltage VOUT3 is at the HIGH level, as long as the voltage VOUT1 is at the LOW level, the voltage VDIV is supplied to the inversion input terminal of the first comparator COMP1.

During a time from timing t30 to timing t55, both of the voltage VOUT1 and the voltage VOUT3 are at the HIGH level, and thus the inversion input terminal of the first comparator COMP1 is connected to the ground potential. Accordingly, even when the input voltage VIN increases after the timing t30, the voltage VOUT1 stays at the HIGH level until the timing t55 at which the voltage VC1 of the capacitor C1 becomes smaller than the third reference voltage VREF3.

An operation performed from the timing t55 to timing t60 is identical to an operation performed from the timing t10 to timing t20. At the timing t10, the voltage VC1 of the capacitor C1 is equal to the ground potential, whereas, at the timing t55, the voltage VC1 of the capacitor C1 is equal to the third reference voltage VREF3. This difference results in a difference between a delay time TD1 and a delay time TD2. By setting the third reference voltage VREF3 to be substantially equal to the ground potential, the delay time TD2 can be made substantially equal to the delay time TD1. That is, it is possible to suppress a phenomenon in which the delay time TD2 is shorter than the delay time TD1 as an original value.

Although it is also conceivable to set the third reference voltage VREF3 to be equal to the ground potential, in a case where the third reference voltage VREF3 varies from a set value (the ground potential) of the third reference voltage VREF3 to a negative value, switching from discharging of the capacitor C1 to charging thereof might not be properly carried out.

It is, therefore, desirable to set the third reference voltage VREF3 to be larger than the ground potential, that is, to set the third reference voltage VREF3 to be larger than 0.

Furthermore, the logic circuit L1 can be configured without using a latch circuit, and thus there is no fear that a latch circuit malfunctions due to noise or the like to output an erroneous logic signal to the switch SW1. That is, the above-described control portion does not include a latch circuit. Thus, it is possible to prevent the above-described control portion from malfunctioning due to noise or the like.

Figure 5:
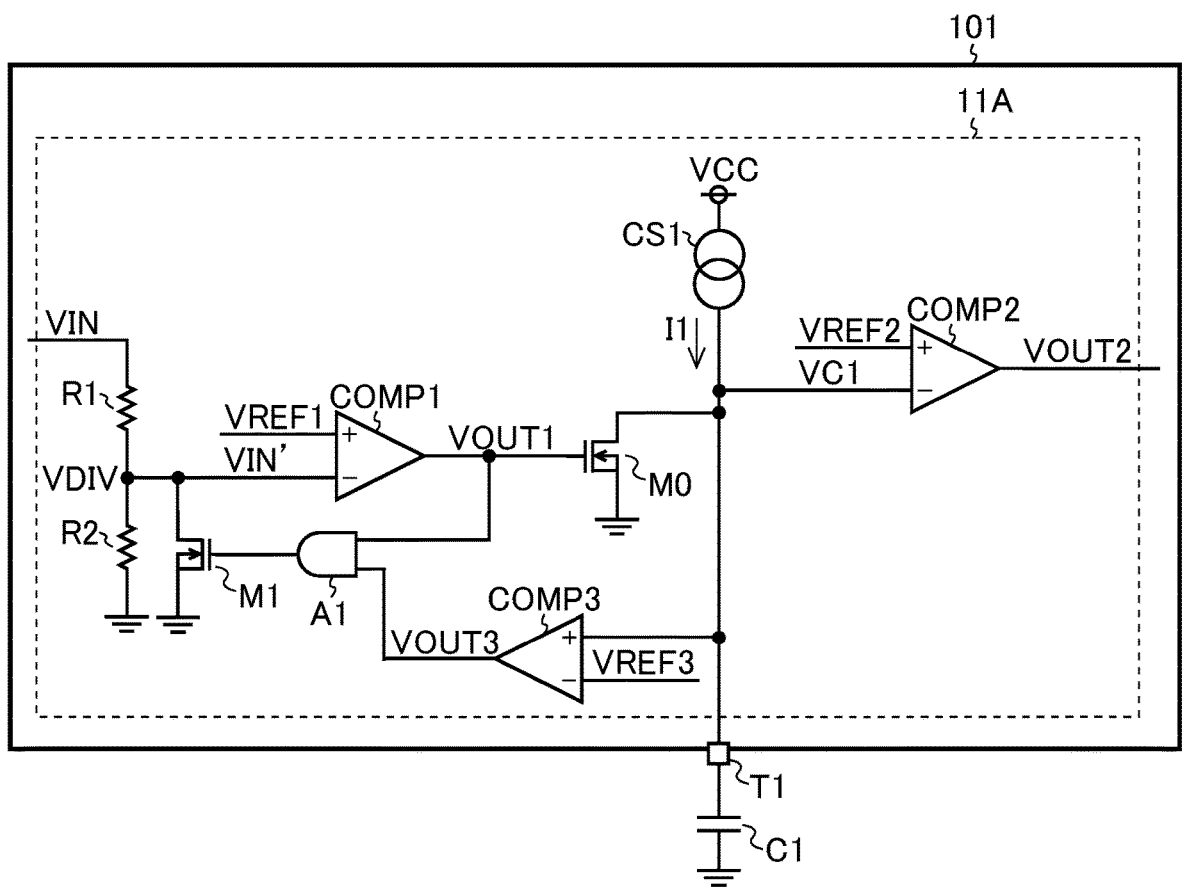
FIG. 5 is a diagram showing a first specific example of the comparator circuit according to the first embodiment.

FIG. 5 is a diagram showing a first specific example of the comparator circuit 11 according to the first embodiment. A comparator circuit 11A is the first specific example of the comparator circuit 11 according to the first embodiment.

The comparator circuit 11A includes an AND gate A1 and an N-channel type first MOS transistor M1. The AND gate A1 is a specific example of a logic circuit L1 of the comparator circuit 11 according to the first embodiment, and the first MOS transistor M1 is a specific example of a switch SW1 of the comparator circuit 11 according to the first embodiment.

A first input terminal of the AND gate A1 is connected to an output terminal of a first comparator COMP1 and a gate of a discharging MOS transistor M0. A second input terminal of the AND gate A1 is connected to an output terminal of a third comparator COMP3. An output terminal of the AND gate A1 is connected to a gate of the first MOS transistor M1.

A drain of the first MOS transistor M1 is connected to the other end of a resistor R1, one end of a resistor R2, and an inversion input terminal of the first comparator COMP1. A source of the first MOS transistor M1 is connected to a ground potential.

Figure 6:
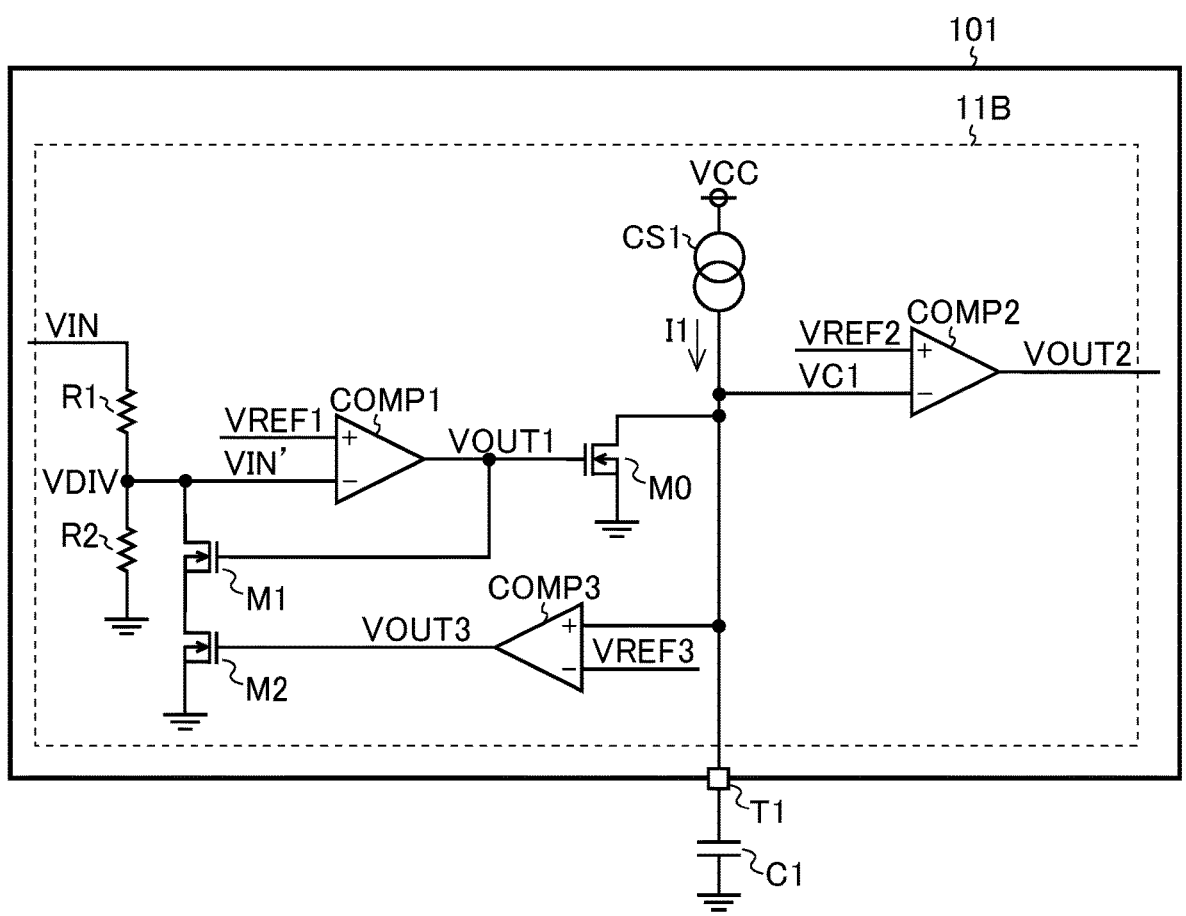
FIG. 6 is a diagram showing a second specific example of the comparator circuit according to the first embodiment.

FIG. 6 is a diagram showing a second specific example of the comparator circuit 11 according to the first embodiment. A comparator circuit 11B is the second specific example of the comparator circuit 11 according to the first embodiment.

The comparator circuit 11B includes an N-channel type first MOS transistor M1 and an N-channel type second MOS transistor M2. The first MOS transistor M1 and the second MOS transistor M2 are a specific example of the logic circuit L1 and the switch SW1 of the comparator circuit 11 according to the first embodiment. The comparator circuit 11B has a circuit configuration in which the logic circuit L1 and the switch SW1 are formed integrally with each other and thus can be formed using a less number of elements than in the comparator circuit 11A.

A gate of the first MOS transistor M1 is connected to an output terminal of a first comparator COMP1 and a gate of a discharging MOS transistor M0. A gate of the second MOS transistor M2 is connected to an output terminal of a third comparator COMP3.

A drain of the first MOS transistor M1 is connected to the other end of a resistor R1, one end of a resistor R2, and an inversion input terminal of the first comparator COMP1. A source of the first MOS transistor M1 is connected to a drain of the second MOS transistor M2. A source of the second MOS transistor M2 is connected to a ground potential.

Second Embodiment

Figure 7:
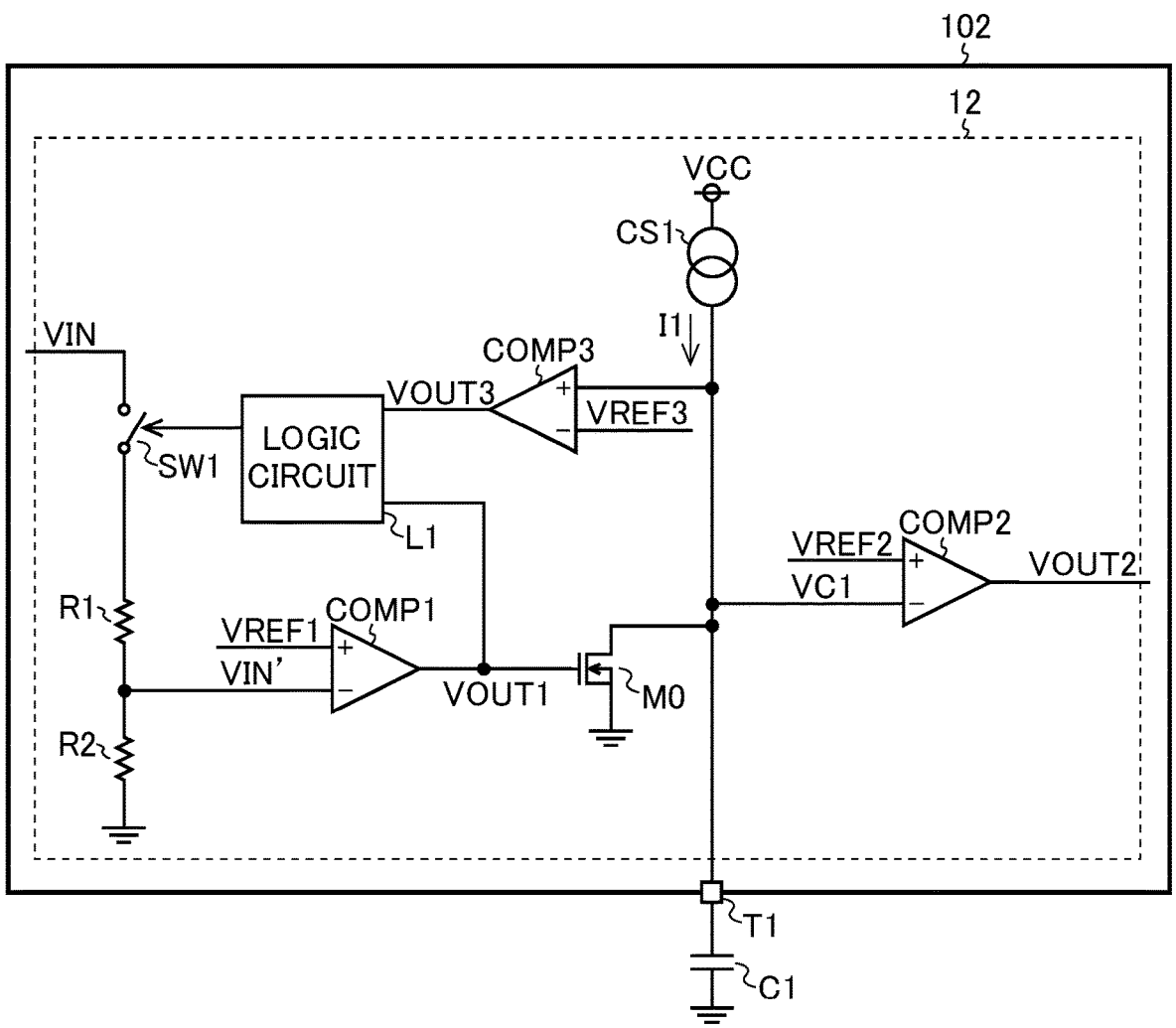
FIG. 7 is a diagram showing a schematic configuration of a semiconductor integrated circuit apparatus according to a second embodiment.

FIG. 7 is a diagram showing a schematic configuration of a semiconductor integrated circuit apparatus 102 according to a second embodiment. In FIG. 7, components common to those in FIG. 3 are denoted by like reference characters, and detailed descriptions thereof are omitted as appropriate.

The semiconductor integrated circuit apparatus 102 according to the second embodiment includes a comparator circuit 12 according to the second embodiment and a terminal T1. A capacitor C1 is externally connected to the terminal T1 of the semiconductor integrated circuit apparatus 102 according to the second embodiment.

The comparator circuit 12 according to the second embodiment is different from the comparator circuit 11 according to the first embodiment in position of a switch SW1 and is identical thereto in other respects. In the comparator circuit 12 according to the second embodiment, an input voltage VIN is applied to one end of the switch SW1, and one end of a resistor R1 is connected to the other end of the switch SW1.

Also in the comparator circuit 12 according to the second embodiment, similarly to the comparator circuit 11 according to the first embodiment, when the switch SW1 is on, a division voltage of the input voltage VIN is supplied to a non-inversion input terminal of a first comparator COMP1, and when the switch SW1 is off, a ground potential is connected to the non-inversion input terminal of the first comparator COMP1.

The comparator circuit 12 according to the second embodiment provides a similar effect to that of the comparator circuit 11 according to the first embodiment.

Figure 8:
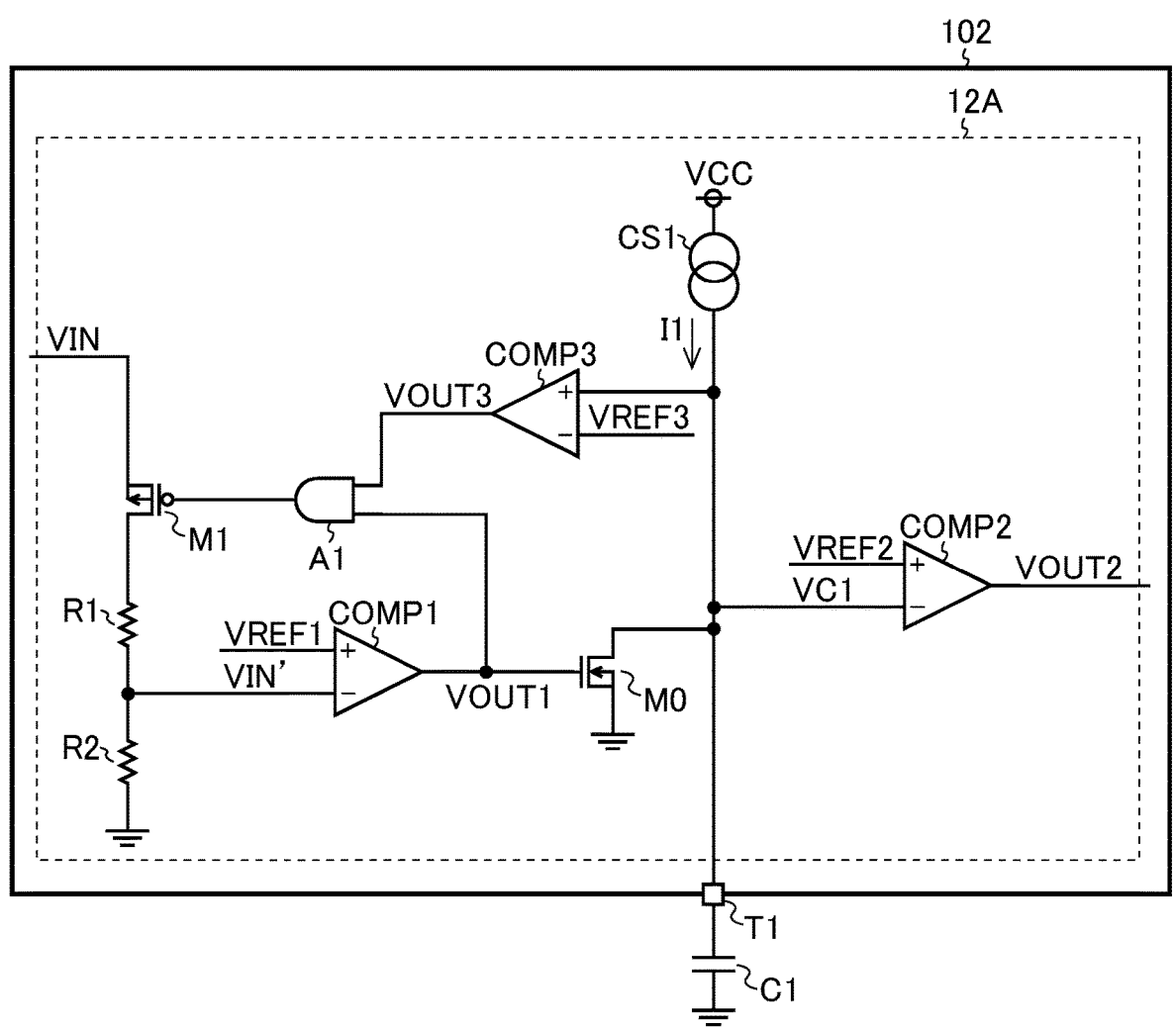
FIG. 8 is a diagram showing a first specific example of a comparator circuit according to the second embodiment.

FIG. 8 is a diagram showing a first specific example of the comparator circuit 12 according to the second embodiment. A comparator circuit 12A is the first specific example of the comparator circuit 12 according to the second embodiment.

The comparator circuit 12A includes an AND gate A1 and a P-channel type first MOS transistor M1. The AND gate A1 is a specific example of a logic circuit L1 of the comparator circuit 12 according to the second embodiment, and the first MOS transistor M1 is a specific example of the switch SW1 of the comparator circuit 12 according to the second embodiment.

A first input terminal of the AND gate A1 is connected to an output terminal of a first comparator COMP1 and a gate of a discharging MOS transistor M0. A second input terminal of the AND gate A1 is connected to an output terminal of a third comparator COMP3. An output terminal of the AND gate A1 is connected to a gate of the first MOS transistor M1.

An input voltage VIN is applied to a source of the first MOS transistor M1. A drain of the first MOS transistor M1 is connected to one end of a resistor R1.

Figure 9:
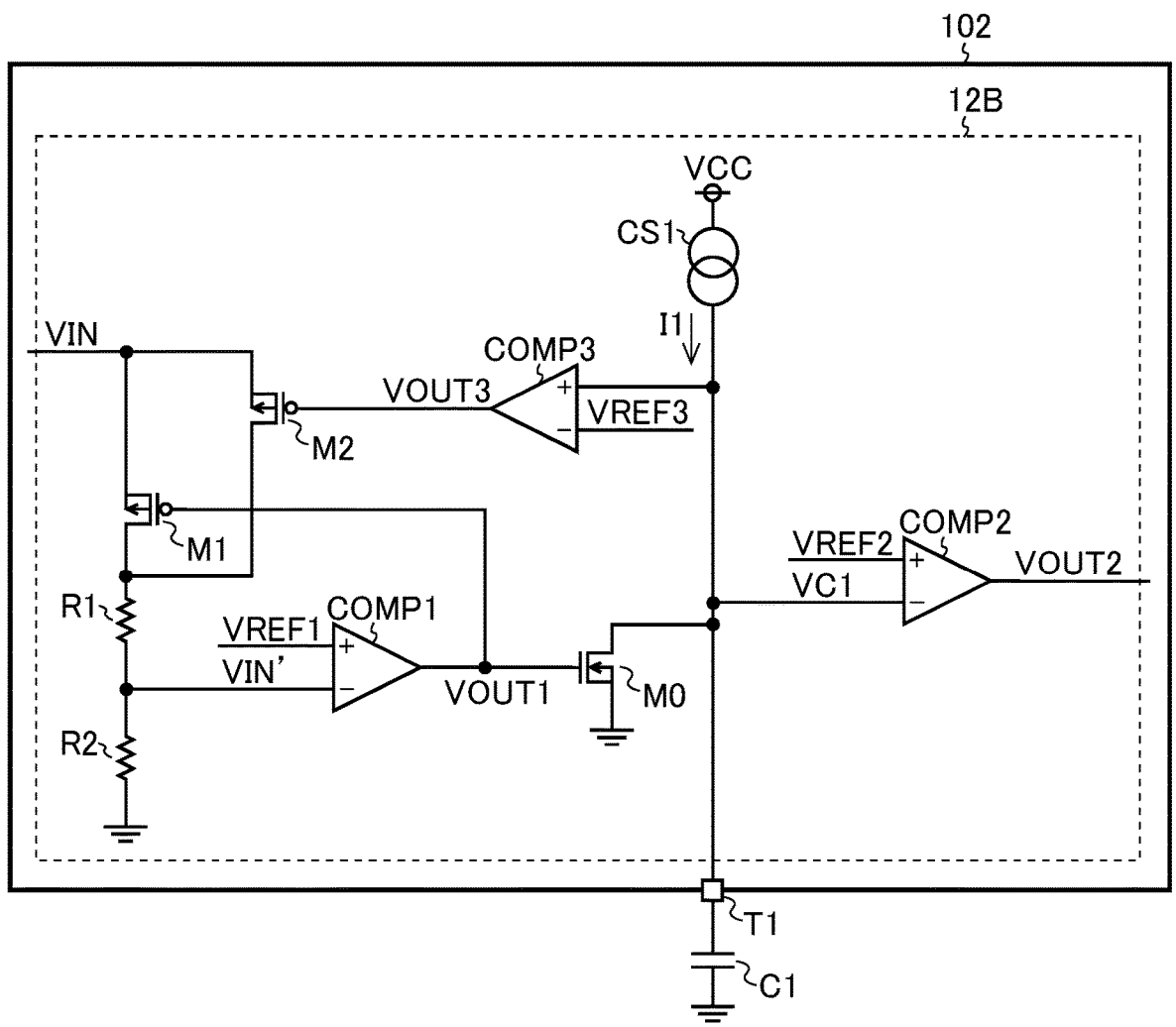
FIG. 9 is a diagram showing a second specific example of the comparator circuit according to the second embodiment.

FIG. 9 is a diagram showing a second specific example of the comparator circuit 12 according to the second embodiment. A comparator circuit 12B is the second specific example of the comparator circuit 12 according to the second embodiment.

The comparator circuit 12B includes a P-channel type first MOS transistor M1 and a P-channel type second MOS transistor M2. The first MOS transistor M1 and the second MOS transistor M2 are a specific example of the logic circuit L1 and the switch SW1 of the comparator circuit 12 according to the second embodiment. The comparator circuit 12B has a circuit configuration in which the logic circuit L1 and the switch SW1 are formed integrally with each other and thus can be formed using a less number of elements than in the comparator circuit 12A.

A gate of the first MOS transistor M1 is connected to an output terminal of a first comparator COMP1 and a gate of a discharging MOS transistor M0. A gate of the second MOS transistor M2 is connected to an output terminal of a third comparator COMP3.

An input voltage VIN is applied to sources of the first MOS transistor M1 and the second MOS transistor M2. Drains of the first MOS transistor M1 and the second MOS transistor M2 are connected to one end of a resistor R1.

Other Embodiments

In addition to the foregoing embodiments, various modifications can be made to the configuration of the present invention without departing from the spirit of the invention.

Applications of the semiconductor integrated circuit apparatus 101 are not particularly limited. For example, when the semiconductor integrated circuit apparatus 101 is a semiconductor integrated circuit apparatus for a switching power source system, the semiconductor integrated circuit apparatus 101 and an external component(s) thereof constitute the switching power source system. Furthermore, for example, when the semiconductor integrated circuit apparatus 101 is an LED driver, the semiconductor integrated circuit apparatus 101 and an external component(s) thereof constitute an LED illuminator. A similar description to that in the case of the semiconductor integrated circuit apparatus 101 applies to applications of the semiconductor integrated circuit apparatus 102.

The voltage VOUT2 outputted from the second comparator COMP2 may be used within the semiconductor integrated circuit apparatus, or a configuration may be adopted in which an open drain circuit or the like is provided in the semiconductor integrated circuit apparatus and used to output a voltage based on the voltage VOUT2 to outside the semiconductor integrated circuit apparatus.

In the foregoing embodiments, the capacitor C1 is externally connected to the semiconductor integrated circuit apparatus. Unlike such a configuration, for example, the capacitor C1 may be built in the semiconductor integrated circuit apparatus.

In the foregoing embodiments, the comparator circuit is configured to include a MOS transistor. Unlike such a configuration, for example, instead of a MOS transistor, a bipolar transistor may be used.

Furthermore, in the foregoing embodiments, the voltage VOUT2 outputted from the second comparator COMP2 is switched from the HIGH level to the LOW level with a delay from timing at which the voltage VOUT1 outputted from the first comparator COMP1 is switched from the HIGH level to the LOW level. Unlike such a configuration, for example, a configuration may be adopted in which the voltage VOUT2 outputted from the second comparator COMP2 is switched from the LOW level to the HIGH level with a delay from timing at which the voltage VOUT1 outputted from the first comparator COMP1 is switched from the LOW level to the HIGH level. To implement this modification example, for example, a configuration could be adopted in which the inversion input terminal and the non-inversion input terminal of the first comparator COMP1 are replaced with each other, the inversion input terminal and the non-inversion input terminal of the second comparator COMP2 are replaced with each other, and as the MOS transistor M1, instead of a N-channel type MOS transistor, a P-channel type MOS transistor is used.

As described above, the foregoing embodiments are to be construed in all respects as illustrative and not limiting. The technical scope of the present invention is indicated by the appended claims rather than by the descriptions of the foregoing embodiments, and it is to be understood that all changes that come within the meaning and range of equivalency of the claims are intended to be embraced therein.

The comparator circuit (11, 12) described thus far has a configuration (a first configuration) including the first comparator (COMP1) configured to compare a voltage based on an input voltage with a first reference voltage, the charge/discharge portion (M0, CS1) configured to switch between charging and discharging of the capacitor (C1) based on an output of the first comparator, the second comparator (COMP2) configured to compare a voltage of the capacitor with a second reference voltage, and the control portion (COMP3, L1, SW1) configured to, in a case where the voltage of the capacitor is larger than a predetermined value when the charge/discharge portion performs switching from the charging of the capacitor to the discharging of the capacitor, supply a predetermined voltage instead of the voltage based on the input voltage to the first comparator until the voltage of the capacitor becomes smaller than the predetermined value so that the discharging of the capacitor is maintained by the charge/discharge portion.

The comparator circuit of the above-described first configuration can suppress the phenomenon in which a delay time becomes shorter than its original value.

The comparator circuit of the above-described first configuration may have a configuration (a second configuration) in which the predetermined value is larger than 0.

In the comparator circuit of the above-described second configuration, even when the predetermined value varies from a set value, switching from discharging of the capacitor to charging thereof can be properly carried out.

The comparator circuit of the above-described first or second configuration may have a configuration (a third configuration) in which the control portion includes a third comparator (COMP3) configured to compare the voltage of the capacitor with a third reference voltage.

In the comparator circuit of the above-described third configuration, the third reference voltage is set to have a predetermined value, and thus the control portion can be formed in a relatively simple configuration.

The comparator circuit of the above-described third configuration may have a configuration (a fourth configuration) in which the control portion includes a switching portion (L1, SW1) configured to switch, based on the output of the first comparator and an output of the third comparator, between supplying the voltage based on the input voltage to the first comparator and supplying the predetermined voltage instead of the voltage based on the input voltage to the first comparator.

In the comparator circuit of the above-described fourth configuration, the control portion can be formed in a more simple configuration.

The comparator circuit of the above-described fourth configuration may have a configuration (a fifth configuration) in which the switching portion includes a first transistor (M1) configured to be switched on or off based on the output of the first comparator and a second transistor (M2) configured to be switched on or off based on the output of the third comparator.

In the comparator circuit of the above-described fifth configuration, the number of elements in the switching portion can be reduced.

The comparator circuit of the above-described fourth or fifth configuration may have a configuration (a sixth configuration) in which the first comparator includes a first input terminal and a second input terminal, the first input terminal is configured to receive the first reference voltage supplied thereto, and the switching portion is configured to switch whether or not to short-circuit the second input terminal to the predetermined voltage.

In the comparator circuit of the above-described sixth configuration, the switching portion can be formed in a relatively simple configuration.

The comparator circuit of the above-described fourth or fifth configuration may have a configuration (a seventh configuration) in which the first comparator includes a first input terminal and a second input terminal, the first input terminal is configured to receive the first reference voltage supplied thereto, the second input terminal is configured to be connected to a first end of a first resistor and a first end of a second resistor, a second end of the second resister is configured to receive the predetermined voltage applied thereto, and the switching portion is configured to switch between applying the input voltage to a second end of the first resistor and setting the second end of the first resistor to an open state.

In the comparator circuit of the above-described seventh configuration, the switching portion can formed in a relatively simple configuration.

The comparator circuit of any of the above-described first to seventh configurations may have a configuration (an eighth configuration) in which the control portion does not include a latch circuit.

The comparator circuit of the above-described eighth configuration can prevent the control portion from malfunctioning due to noise or the like.

The semiconductor integrated circuit apparatus described thus far has a configuration (a ninth configuration) including the comparator circuit of any of the above-described first to eighth configurations.

The semiconductor integrated circuit apparatus of the above-described ninth configuration can suppress the phenomenon in which a delay time in the comparator circuit becomes shorter than its original value.

REFERENCE SIGNS LIST 10 comparator circuit according to reference example
11 comparator circuit according to first embodiment
11A, 11B, 12A, 12B comparator circuit
12 comparator circuit according to second embodiment
100 semiconductor integrated circuit apparatus according to reference example 101 semiconductor integrated circuit apparatus according to first embodiment
102 semiconductor integrated circuit apparatus according to second embodiment
A1 AND gate
C1 capacitor
CS1 current source
COMP1 to COMP3 first to third comparators
L1 logic circuit
M0 discharging MOS transistor
M1 first MOS transistor
M2 second MOS transistor
R1, R2 resistor
T1 terminal
SW1 switch

The invention claimed is:

1. A comparator circuit, comprising:
a first comparator configured to compare a voltage based on an input voltage with a first reference voltage;
a charge/discharge portion configured to switch between charging and discharging of a capacitor based on an output of the first comparator;
a second comparator configured to compare a voltage of the capacitor with a second reference voltage; and
a control portion configured to, in a case where the voltage of the capacitor is larger than a predetermined value when the charge/discharge portion performs switching from the charging of the capacitor to the discharging of the capacitor, supply a predetermined voltage instead of the voltage based on the input voltage to the first comparator until the voltage of the capacitor becomes smaller than the predetermined value so that the discharging of the capacitor is maintained by the charge/discharge portion,
wherein the control portion includes a third comparator configured to compare the voltage of the capacitor with a third reference voltage.

2. The comparator circuit according to claim 1, wherein the control portion includes a switching portion configured to switch, based on the output of the first comparator and an output of the third comparator, between supplying the voltage based on the input voltage to the first comparator and supplying the predetermined voltage instead of the voltage based on the input voltage to the first comparator.

3. The comparator circuit according to claim 2, wherein the switching portion includes:
a first transistor configured to be switched on or off based on the output of the first comparator; and
a second transistor configured to be switched on or off based on the output of the third comparator.

4. The comparator circuit according to claim 2, wherein the first comparator includes a first input terminal and a second input terminal,
the first input terminal is configured to receive the first reference voltage supplied thereto, and
the switching portion is configured to switch whether or not to short-circuit the second input terminal to the predetermined voltage.

5. The comparator circuit according to claim 2, wherein the first comparator includes a first input terminal and a second input terminal,
the first input terminal is configured to receive the first reference voltage supplied thereto,
the second input terminal is configured to be connected to a first end of a first resistor and a first end of a second resistor,
a second end of the second resister is configured to receive the predetermined voltage applied thereto, and
the switching portion is configured to switch between applying the input voltage to a second end of the first resistor and setting the second end of the first resistor to an open state.

6. The comparator circuit according to claim 1, wherein the control portion does not include a latch circuit.

7. A semiconductor integrated circuit apparatus, comprising:
the comparator circuit according to claim 1.

8. The comparator circuit according to claim 1, wherein the predetermined value is larger than 0.

* * * * *